(12) United States Patent
Pihlman et al.

(10) Patent No.: US 10,123,419 B2
(45) Date of Patent: Nov. 6, 2018

(54) SURFACE-MOUNTABLE POWER DELIVERY BUS BOARD

(71) Applicant: Intel Corporation, Santa Clara, CA (US)

(72) Inventors: Jeffrey A. Pihlman, Stellacoom, WA (US); John C. Tomlin, Lacey, WA (US)

(73) Assignee: Intel Corporation, Santa Clara, CA (US)

( * ) Notice: Subject to any disclaimer, the term of this patent is extended or adjusted under 35 U.S.C. 154(b) by 154 days.

(21) Appl. No.: 15/085,080

(22) Filed: Mar. 30, 2016

(65) Prior Publication Data

US 2017/0290158 A1 Oct. 5, 2017

(51) Int. Cl.
*H05K 7/12* (2006.01)
*H05K 1/14* (2006.01)
*H05K 1/11* (2006.01)
*H05K 1/18* (2006.01)
*H05K 1/02* (2006.01)
*H05K 3/40* (2006.01)
(Continued)

(52) U.S. Cl.
CPC ....... *H05K 1/181* (2013.01); *H01L 23/49816* (2013.01); *H05K 1/0296* (2013.01); *H05K 1/111* (2013.01); *H05K 1/144* (2013.01); *H05K 3/10* (2013.01); *H05K 3/341* (2013.01); *H05K 3/4007* (2013.01); *H01R 12/727* (2013.01); *H05K 1/14* (2013.01); *H05K 2201/041* (2013.01); *H05K 2201/042* (2013.01); *H05K 2201/045* (2013.01); *H05K 2201/10037* (2013.01); *H05K 2201/10734* (2013.01); *H05K 2201/2036* (2013.01)

(58) Field of Classification Search
CPC .... H05K 1/144; H05K 2201/041; H05K 1/14; H05K 2201/042; H05K 2201/045; H05K 2201/2036; H01R 12/727
USPC ....... 361/742, 770, 784, 790, 791, 803, 804; 174/261; 257/697
See application file for complete search history.

(56) References Cited

U.S. PATENT DOCUMENTS

2004/0184248 A1\* 9/2004 Alger .................... H05K 1/141
                                                                       361/777
2007/0075431 A1\* 4/2007 Miyazaki ............. H05K 1/0263
                                                                        257/773
(Continued)

OTHER PUBLICATIONS

Internation Search Report and Written Opinion for International Patent Application No. PCT/US2017/018731, dated May 18, 2017.

*Primary Examiner* — Binh Tran
(74) *Attorney, Agent, or Firm* — Green, Howard, & Mughal LLP.

(57) ABSTRACT

IC device assemblies including a power delivery bus board that is mounted to a primary PCB (i.e., motherboard) that further hosts a power-sink device and a power-source device. The bus board, as a secondary PCB, may be surface-mounted on a back side of the primary PCB opposite the power source and sink devices, which are mounted on the front side of the primary PCB. The bus board need only be dimensioned so as to bridge a length between first and second back-side regions of the primary PCB that are further coupled to a portion of the front-side pads employed by the power-sink device. The secondary PCB may be purpose-built for conveying power between the source and sink devices, and include, for example, short, wide traces, that may be formed from multiple heavyweight metallization layers.

17 Claims, 8 Drawing Sheets

(51) Int. Cl.
    *H05K 3/10*        (2006.01)
    *H05K 3/34*        (2006.01)
    *H01L 23/498*    (2006.01)
    *H01R 12/72*       (2011.01)

(56) References Cited

U.S. PATENT DOCUMENTS

| | | |
|---|---|---|
| 2007/0222059 A1 | 9/2007 | Roberts et al. |
| 2011/0169562 A1 | 7/2011 | Li et al. |
| 2014/0001639 A1 | 1/2014 | Hiraishi et al. |

\* cited by examiner

SURFACE-MOUNTABLE POWER DELIVERY BUS BOARD

BACKGROUND

Integrated circuit (IC) devices are often mounted onto a printed circuit board (PCB) to form a printed circuit assembly (PCA). The PCA may be a computer-processing platform of a mobile computer (e.g., laptop, or mobile phone), a desktop personal computer, a data processing rack server, or the like. The PCB typically includes multiple layers of conductive trace metallization interconnecting the various packaged IC devices and discrete components that are mounted to the board. PCB trace layers may be employed for power delivery and signal routing.

FIG. 1A depicts a plan view of a conventional ball-grid array (BGA) packaged-device 101 that is to receive power from traces on a PCB. BGA-packaged-device 101 includes a plurality of solder balls 105 that may provide power and ground connections or signal input/output (I/O) to one or more ICs contained within the package. In the illustrated example, power connections are grouped together within a BGA power corridor 110 extending from the outer package edge to near the center of the package. Land-side components (LSCs) 120 may also be disposed a various locations within the ball-grid array.

FIG. 1B depicts a plan view of a front side of a conventional PCB 102 configured to power conventional packaged-device 101. PCB 102 includes a power corridor 112 extending between front-side pads 126 that are to mount the power-source device (e.g., a voltage regulator) and a portion of front-side BGA pads 115 that are to be joined to BGA lands that are within BGA power corridor 110. FIG. 1C depicts a cross-sectional view through a conventional PCA 103 including a power-source device 125 and packaged-device 101 mounted to PCB 102. Depending on the complexity of the IC, packaged-device 101 may require as much as 50-200 W of power, requiring the use of all (e.g., 8) PCB metallization layers 135 (including signal routing layers) for power and ground routing within power corridor 112. Through-board vias 136 are employed at the ends of power corridor 112 to couple together the multiple PCB metallization layers. Grouping power connections within power corridor 112 enables full use of PCB metallization and has significant advantages in terms of a smaller form-factor relative to running an external cable between connectors at the power-source device 125 and power-sink device 101. However, enlisting PCB metallization layers in this fashion may require a greater number of BGA package connections to be assigned to the voltage supply than is needed for power delivery as determined based on an electrical current/pin specification. For example, limitations imposed on the weight of copper in the PCB metallization layers and/or limitations imposed on the number of metallization layers in the PCB aimed at keeping board costs down may ultimately reduce the number of BGA connections in packaged-device 101 available for signal assignment. Also, although power corridor 112 attempts to minimize the disruption and loss of signal routing paths by confining the portion of the PCB dedicated to the supply of power, I/O escape path routing is still negatively impacted.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
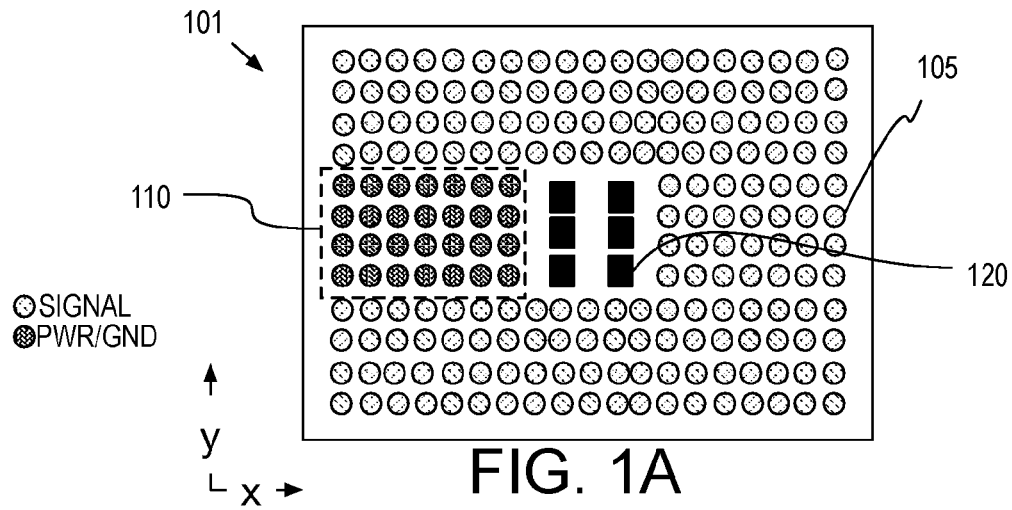
FIG. 1A depicts a plan view of a conventional packaged-device.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

IC device assemblies including a power delivery bus board are described herein. In some exemplary embodiments, the power delivery bus board is a secondary PCB that is mounted to a primary PCB. The primary PCB, or motherboard, further hosts both a power-sink device and a power-source device. The power deliver bus board is to at least partially offload from the primary PCB a power bus extending between the power source and sink devices. In some embodiments, the bus board is surface-mounted on a back side of the primary PCB opposite the power source and sink devices, which are mounted on the front side of the primary PCB. The bus board need only be dimensioned so as to bridge a length between first and second back-side regions of the primary PCB that are coupled to a portion of the front-side pads that are employed to power the power-sink device. The bus board may be purpose-built for power delivery including, for example, short, wide traces, that are potentially formed from multiple heavy-weight metallization layers. Being directly surface-mounted to the primary PCB, the assembly may have a form factor small enough for any platform that allows for two-sided surface mounted PCBs. The primary PCB, being free from the constraint of supplying power to the power-sink device, need only include the number of metallization layers and weights needed for signal routing to/from the power-sink device and/or other IC devices. The cost of the primary PCB may therefore be reduced. Furthermore, signal trace escape routing on the primary PCB may be improved since no region (e.g., power corridor) of the primary PCB need be dedicated to power delivery.

Figure 2A:
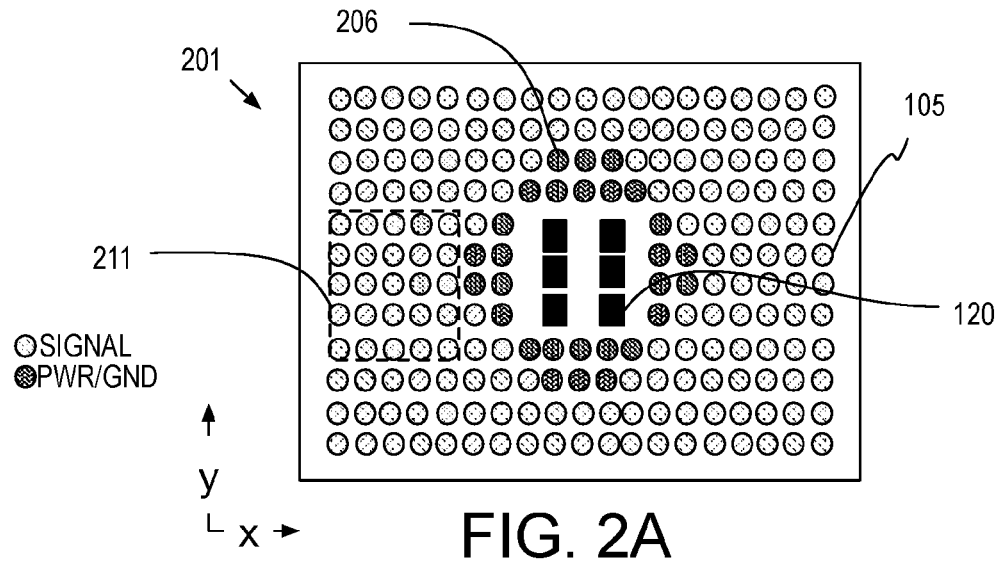
FIG. 2A depicts a plan view of a packaged-device, in accordance with some embodiments.

FIG. 2A depicts a plan view of a packaged-device 201, in accordance with some embodiments. Packaged-device 201 may include one or more IC. In some embodiments, packaged-device 201 includes one or more microprocessor. In some other embodiments, packaged-device 201 includes a system-on-chip (SoC) that may include one or more processor cores, RF communication blocks, and memory arrays. The IC may be attached on a chip-side of the package, for example to a package substrate. The package substrate has a land-side, opposite the chip-side, which may further include BGA lands. The BGA lands may be exposed within openings in a solder resist, to which solder balls 105 are applied. Packaged-device 201 may be directly surface-mounted, or a surface-mounted socket may interface device 201 to a PCB. In some embodiments, packaged-device 201 is compatible with Surface Mount Technology (SMT), and may be, for example, any of a flip-chip package (FCBGA), package-on-package (PoP), system-in-package (SiP), embedded wafer-layer ball (eWLB), wafer-layer chip-scale packaging (WLCSP), or the like. In some alternative embodiments, packaged-device 201 is compatible a land grid array (LGA) socket.

In some embodiments, the portion of the connections of a packaged-device that are to supply power (and ground) are surrounded by the portion of connections that are to handle signal I/O. In the exemplary embodiment illustrated in FIG. 2A, BGA signal connections form a perimeter completely surrounding BGA power/ground connections 206. Hence, whereas in FIG. 1A, packaged-device 101 included power corridor 110, packaged-device 201 includes signal connections 211 within this same region. For the exemplary embodiment illustrated in FIG. 2A, power connections 206, are arrayed in a pattern (e.g., an annulus) forming a perimeter of connections surrounding LSCs 120.

Figure 1B:
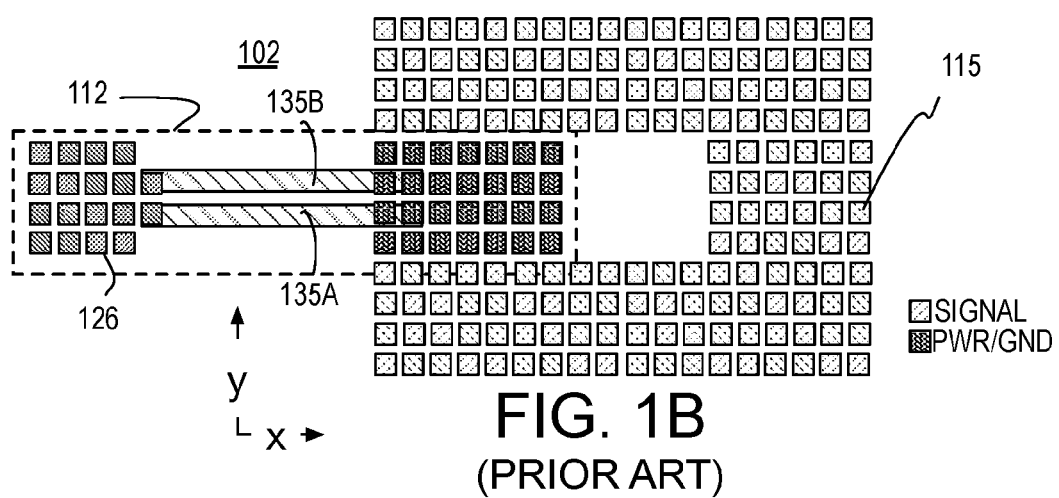
FIG. 1B depicts a plan view of a front side of a conventional PCB configured to power a conventional packaged-device.
Figure 2B:
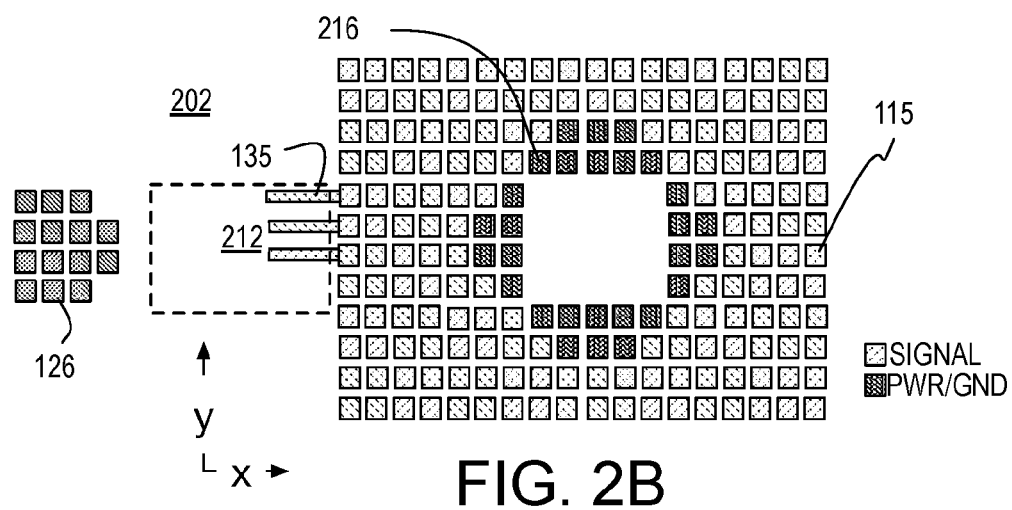
FIG. 2B depicts a plan view of a front side of a PCB configured to power a packaged-device, in accordance with some embodiments.

FIG. 2B depicts a plan view of a front side of a PCB 202 configured to power packaged-device 201, in accordance with some embodiments. PCB 202 includes front-side BGA pads 115 coupled to PCB signal trace routing and front-side BGA pads 216 coupled to PCB power/ground trace routing. In the exemplary embodiment illustrated in FIG. 2B, PCB signal routing emanates from front-side BGA signal pads 115 in all directions. Hence, whereas in FIG. 1B, PCB 102 included power corridor 112, in FIG. 2A, PCB 202 includes additional signal trace routing (e.g., microstrip and/or stripline architectures) in region 212 between power-source device 125 the power-sink device.

Figure 1C:
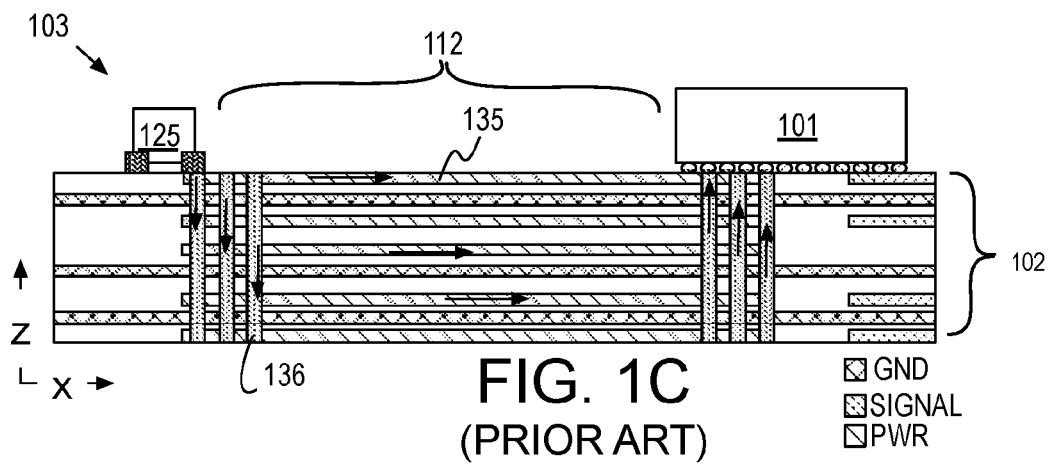
FIG. 1C depicts a cross-sectional view through conventional assembly of a PCB and a packaged-device.
Figure 2C:
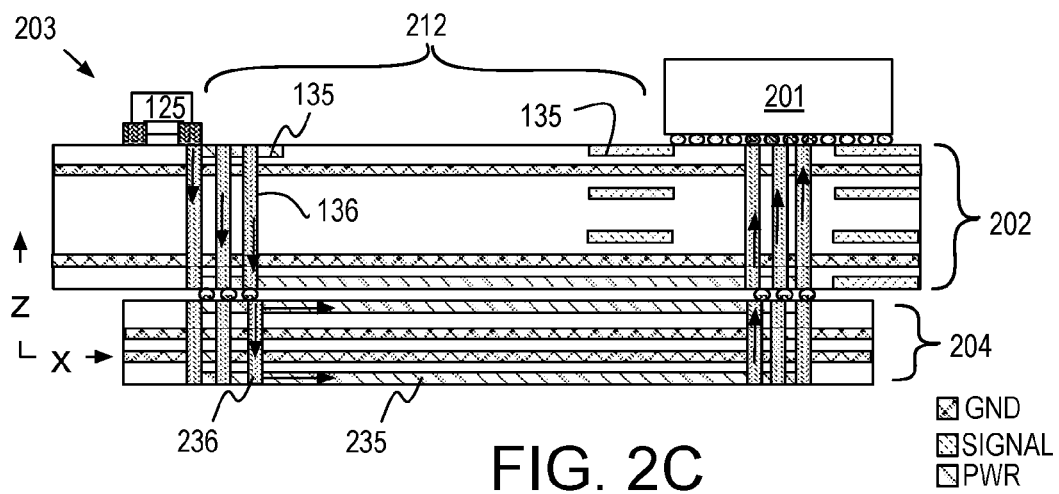
FIG. 2C depicts a cross-sectional view through an assembly including power source and sink device mounted to a primary PCB, and a surface-mounted power delivery bus board, in accordance with some embodiments.

FIG. 2C depicts a cross-sectional view through a PCA 203, in accordance with some embodiments. Assembly 203 includes power-source device 125 and power-sink device 201 mounted to separate regions on a front side of primary PCB 202. In this example, primary PCB 202 has a reduced number of metallization layers (e.g., 6). Primary PCB 202 may therefore be of lower cost than PCB 102 (FIG. 1C). In further reference to FIG. 2C, power-source device 125 and power-sink device 201 are mounted to adjacent regions of a front-side surface of primary PCB 202. In some embodiments, power-source device 125 includes two or more voltage regulators, each providing a different voltage layer on a separate power rail.

Assembly 203 further includes a printed power delivery bus board 204 surface-mounted to a back side of primary PCB 202. Power delivery bus board 204 is a secondary PCB providing electrical power connections between power-source device 125 and power-sink device 201. In the illustrated embodiment, power delivery bus board 204 includes a plurality of metallization layers 235 coupled to through-board vias 236. As further describe below, through-board vias 236 are further coupled to a plurality of conductive surface features which are soldered to back-side pads disposed on a back side of primary PCB 202. The back-side pads are further coupled to through-board vias 136 which interconnect to the front-side BGA pads 216 that connect to power supply BGA lands on power-sink device 201.

In some embodiments power delivery between source and sink points on a PCB is provided exclusively by a secondary, surface-mounted power delivery bus board. In the example illustrated in FIG. 2C, metallization layers of PCB 202 are not utilized for delivery of power to packaged-device 201 beyond routing to and from the through-board vias 136. In some advantageous embodiments, metallization layers 135 within PCB region 212 located between power-source device 125 power-sink device 201 may be employed to route signals to/from packaged-device 201.

Figure 3:
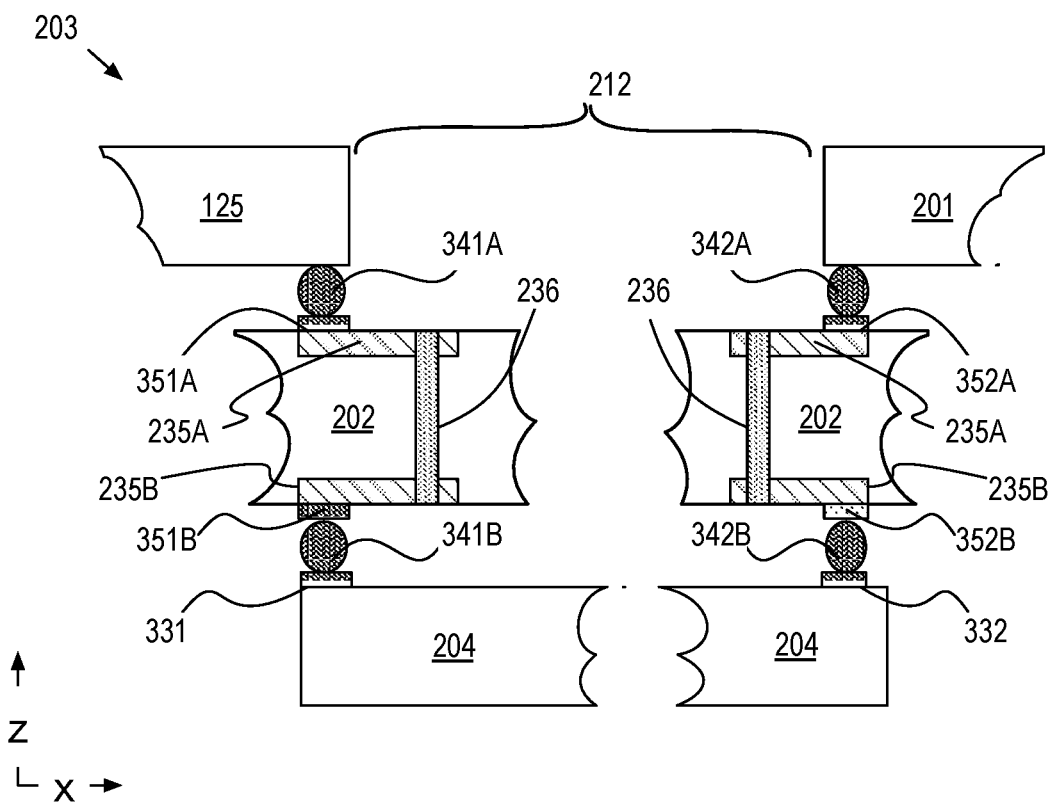
FIG. 3 depicts an expanded cross-sectional view of an assembly further illustrating electrical interconnections between front-side mounted devices, a primary PCB, and a power delivery bus board, in accordance with some embodiments.

FIG. 3 depicts an expanded cross-sectional view of PCA 203 further illustrating electrical interconnections between primary PCB 202, front-side mounted power-source and power-sink devices 125, 201, and power delivery bus board 204, in accordance with some embodiments. As shown, power-source device 125 is joined by solder feature 341A to front-side PCB pad 351A. Front-side PCB pad 351A is interconnected to through-board via 236 by a short metallization trace 235A. Through-board via 236 is further interconnected to a back-side pad 351B by a second short metallization trace 235B. Alternatively, front-side and back-side pads 351A, 351B may be directly connected to through-board via 236. Solder feature 341B connects back-side pad 351B to a pad 331 (or other conductive surface feature) on a front side of power delivery bus board 204. Likewise, power-sink device 201 is joined by solder feature 342A to another front-side PCB pad 352A. Front-side PCB pad 352A is interconnected to another through-board via 236 by another short metallization trace 235A. Through-board via 236 is further interconnected to another back-side pad 352B by another short metallization trace 235B. Alternatively, front-side and back-side pads 352A, 352B may be directly connected to through-board via 236. Solder feature 342B connects back-side pad 352B to a pad 332 (or other conductive surface feature) on a front side of power delivery bus board 204.

Solder features 341A, 341B, 342A, 342B may be of any solder composition known to be suitable for BGA packages. In some exemplary embodiments, the solder features are a Sn—Ag—Cu (SAC) alloy, such as, but not limited to SAC 305 or SAC 405. In some embodiments, solder features 341A-342B have voids of at least 5% of solder area. Voids may be present at the interface of lands, or may be located in the bulk of solder features. In some embodiments, solder features have voids of at least 5% of solder area within the solder bulk with void area potentially being even higher at the interface of lands. In some embodiments, the solder features have voids of at least 10% solder area. The existence of voids, particularly those within the solder feature bulk, is indicative of a solder paste process. Voids are generally a result of volatile organic compounds (VOCs) within a solder paste and form as the paste is reflowed into the solder features. Voiding area is generally a well-characterized quality control parameter monitored in paste-based solder processes. Voiding may be absent where a solder ball pick-and-place process is employed because solder balls that are picked-and-placed onto a package substrate are typically purely metallic, lacking any significant VOC content.

Figure 4A:
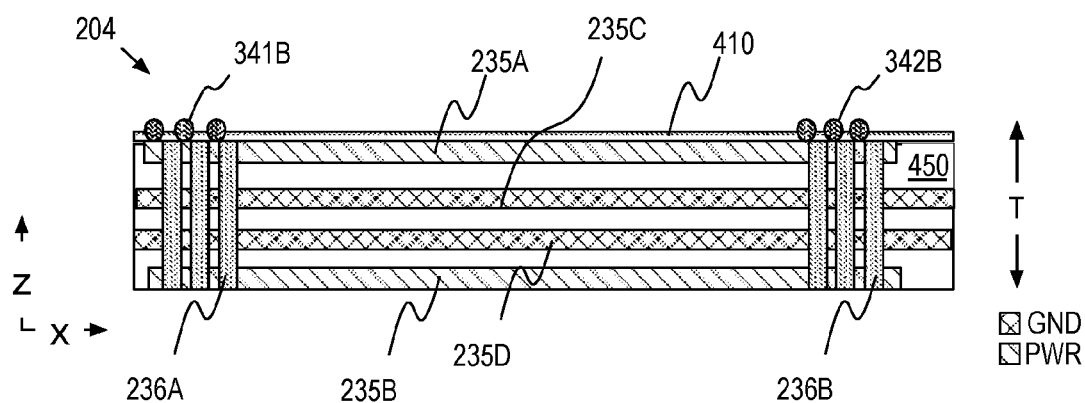
FIG. 4A depicts a cross-sectional view through a surface-mountable printed power delivery bus board, in accordance with some embodiments.

A power delivery bus board may include any number of conductive layers (e.g., 2-12). FIG. 4A depicts a cross-sectional view through surface-mountable printed power delivery bus board 204, in accordance with some embodiments. Bus board 204 is a multi-layered PCB including a conductive trace layer 235A on a front side, and a conductive trace layer 235B on a back side of the PCB (i.e., double-sided). In further embodiments, power delivery bus board 204 includes inner conductive trace layers 235C, 235D. In the illustrative embodiment, inner conductive trace layers 235C, 235D are ground planes while outer conductive trace layers 235A, 235B are power planes. Trace layers may have any plating weight, and may be advantageously heavy, to permit up to 1A/BGA-pad for example. Heavy weight and a wide trace dimension may reduce the number of BGA pads needed for power ingress, thereby enabling a higher single I/O connection count for a give device footprint. In some examples, copper is 5 oz., or more for power planes (e.g., layers 235A, 235B), and 4 oz., or more, for ground planes (e.g., layers 235C, 235D). Conductive trace layers are separated in a laminate structure by intervening layers of dielectric material 450, which may be, for example, woven glass and epoxy prepreg (e.g., FR-4) built up over a core. Conductive layers 235A-235D may be any material, such as a metal (e.g., copper).

Power delivery bus board 204 further includes at least two sets of through-board vias 236A, 236B, one set at either end of the board to couple power in-to and out-of the conductive traces layers 235A-235D. Power delivery bus board 204 is advantageously maintained below some threshold thickness such that the mounted thickness T remains below a limit imposed by an overall thickness specification for the PCA. In some embodiments, thickness T is no more than 0.1". The board thickness may be as little as 0.05-0.7", for example, with the reflowed solder connections accounting for another 200-750 μm in z-height. In some embodiments represented by FIG. 4A, a solder resist 410 is disposed on a front-side surface of power delivery bus board 204. The solder resist may be any known in the art, such as a photo-sensitive coating. Within openings of the solder resist are conductive surface features (e.g., BGA pads) to which a solder features (e.g., solder balls) 341B, 342B may be applied.

Figure 4B:
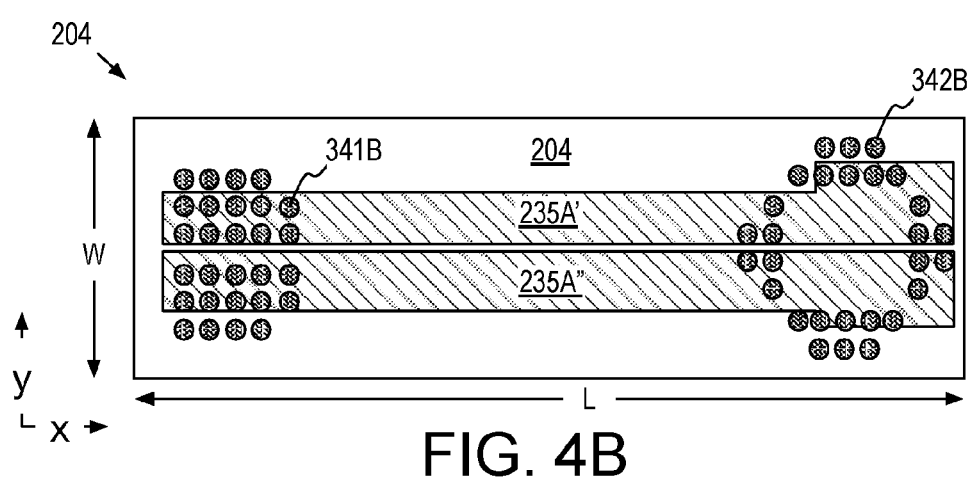
FIG. 4B depicts a plan view of a front-side of a surface-mountable printed power delivery bus board, in accordance with some embodiments.

FIG. 4B depicts a plan view of a front-side of surface-mountable power delivery bus board 204, in accordance with some embodiments. At a first end, bus board 204 includes a plurality of conductive surface features that are to be coupled to a primary PCB by solder features 341B. At a second end, board 204 includes a plurality of conductive surface features that are to be coupled to a primary PCB by solder features 342B. In some embodiments, as illustrated, the plurality of conductive features (e.g., BGA-pads) are arrayed into the same pattern as that of the BGA-lands present on a front side of a primary PCB that are employed for power connection. For example, in FIG. 4B, solder features 342B are arrayed into an annulus matching the annulus of front-side BGA pads 216 (FIG. 2B). Hence, with the vertical interconnection architecture illustrated in FIG. 3, BGA-land layout on ends of power delivery bus board 204 may be substantially the same as the front-side pad layout on the primary PCB. BGA-lands on ends of power delivery bus board 204 may also be vertically aligned with the front-side pad layout on the primary PCB where the lateral trace runs (e.g., 235A, 235B in FIG. 3) overlap. Within bus board 204, each trace layer may be patterned to couple one or more power rails. In the exemplary embodiment shown in FIG. 4B, two power rails 235A' and 235A" are illustrated. Each power rail (e.g., 235A' in FIG. 4B) may be further coupled to one or more other metallization layer (e.g., 235B in FIG. 4A).

Power delivery bus board 204 may be dimensioned to a minimum longitudinal length L required to bridge a distance between the back-side pads on the primary PCB to which solder features 341B, 342B are to connect. In exemplary embodiments, length L is substantially equal to the spacing between the power-source and power-sink devices coupled together by board 204. In some embodiments length L may be 100-125 mm. Likewise, power delivery bus board 204 may be dimensioned to a minimum transverse width W needed to accommodate the arrays of solder features 341B, 342B. In exemplary embodiments, width W is substantially equal to the larger of the power-source device footprint width and the power-sink device footprint width.

Figure 5A:
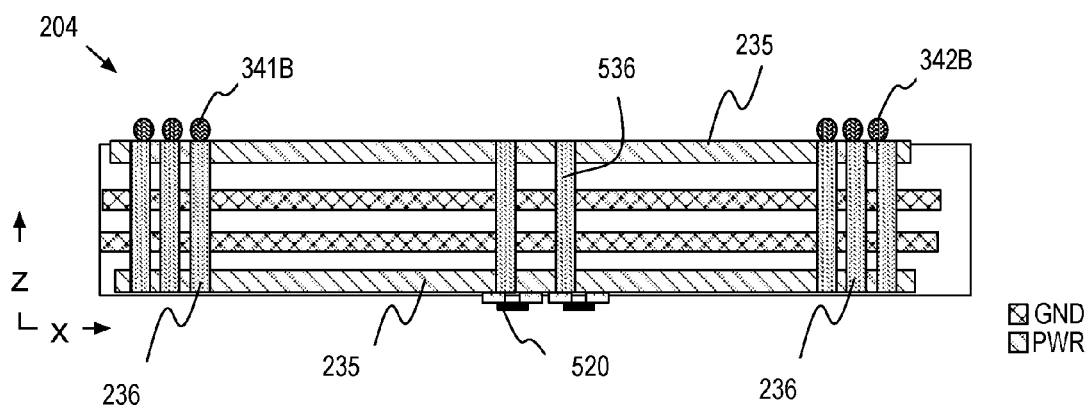
FIG. 5A depicts a cross-sectional view through a surface-mountable printed power delivery bus board, in accordance with some alternate embodiments.
Figure 5B:
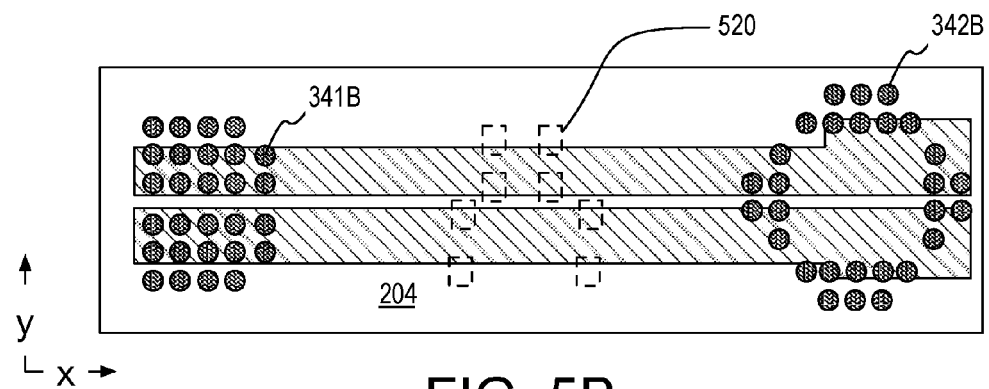
FIG. 5B depicts a plan view of a front-side of a surface-mountable printed power delivery bus board, in accordance with some alternate embodiments.

In some embodiments, a power delivery bus board further includes one or more discrete components. FIGS. 5A and 5B depict a cross-sectional view and a top-side plan view, respectively of a surface-mountable printed power delivery bus board 204 including discrete components 520, in accordance with some alternate embodiments. The choice of components that may be mounted on one or more sides of the power delivery bus board may be limited by overall z-height constraints of the PCA. Some components having a minimal z-height, such as capacitors, may be added to a front side and/or back side of the power delivery bus board. In the example embodiment illustrated in FIGS. 5A and 5B, discrete components 520 comprise decoupling capacitors disposed on a back side of power delivery bus board 204, opposite solder features 341B, 342B. The decoupling capacitors may be connected across a power rail and ground. One or more such decoupling capacitors may be coupled to each power rail. In some further embodiments, a third set of through-board vias 536 is included in power delivery bus board 204, for example to interconnect components 520 (e.g., decoupling capacitors) to ground and/or power metallization levels. In some other embodiments, a power delivery bus board further includes one or more signal trace in addition to the power bus traces. Such signal traces may, for example, convey control signals between a power-source device and a sink device.

Figure 6:
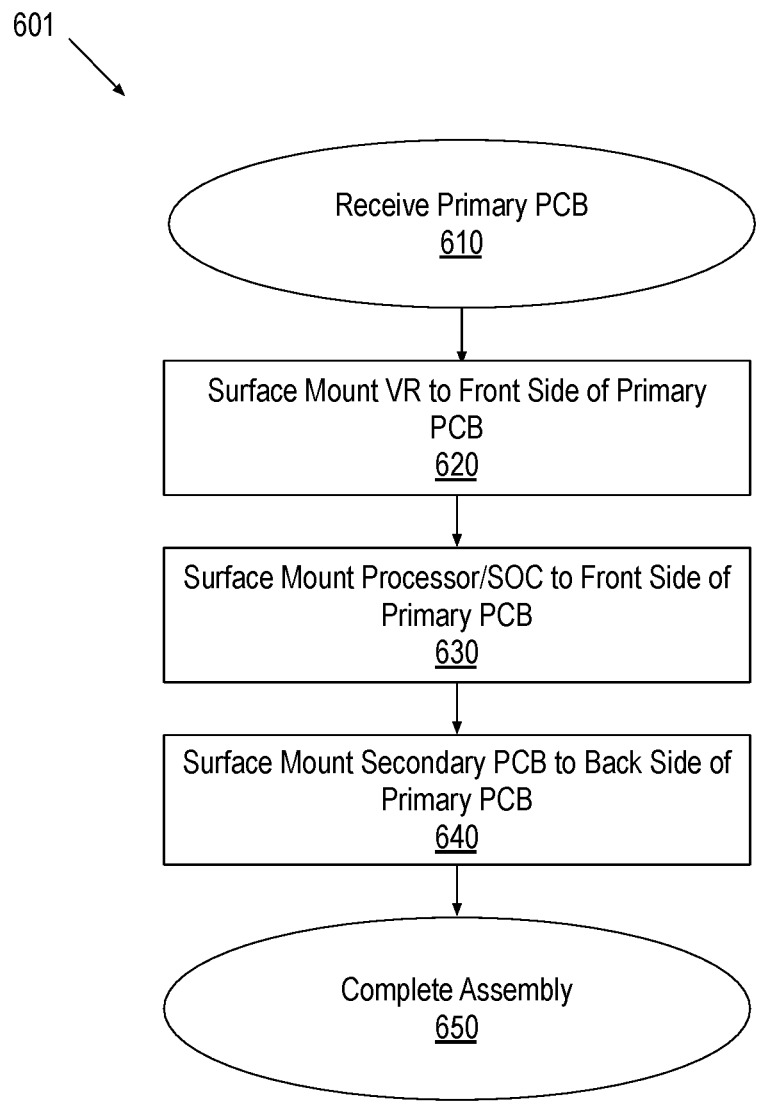
FIG. 6 is a flow diagram illustrating a method of assembling a system including a pair of devices coupled through a printed power delivery bus board, in accordance with some embodiments.

Power delivery bus boards and PCAs employing such boards having one or more of the features described above may be fabricated and assembled by applying various techniques. FIG. 6 is a flow diagram illustrating a method 601 for assembling a PCA including a pair of devices coupled through a printed power delivery bus board, in accordance with some embodiments. Method 601 begins with receiving a primary PCB at operation 610. The primary PCB received at operation 610 may include any of the features described above. In some embodiments, the primary PCB includes front-side pads disposed within a first front-side region of the primary PCB and second front-side pads disposed within a second front-side region of the primary PCB. The primary PCB further includes first back-side pads disposed within a first back-side region, opposite the first front-side region. The first back-side pads are electrically coupled through the primary PCB to the first front-side pads. The primary PCB further includes second back-side pads disposed within a second back-side region, opposite the second front-side region. The second back-side pads are electrically coupled through the primary PCB to a first portion of the second front-side pads.

Method 601 continues at operation 620 where a power-source device, such as one or more voltage regulators outputting one or more voltage rails, is mounted to the front side of the primary PCB. In some embodiments, the power-source device is surface-mounted, for example with a reflowed BGA, to the first front-side pads. At operation 630, a power-sink device, such as one or more microprocessors, is mounted to the front side of the primary PCB. In some embodiments, the power-sink device is surface-mounted, for example with a reflowed BGA, to the second front-side pads on the primary PCB.

Method 602 continues at operation 640 where a bus board is mounted to a back side of the primary PCB. The bus board is mounted so as to bridge a length between the first and second back-side regions. In some embodiments, the bus board is surface-mounted, for example with a reflowed BGA, to the back-side pads. The bus board may have any of the features described above. In some embodiments, the bus board includes two or more layers of conductive traces electrically coupling the first and second back-side pads, thereby interconnecting outputs of the power-source device to power inputs of the power-sink device. Method 601 is then completed at operation 650 where assembly of the IC device is completed using any known techniques.

Although illustrated as a particular set of operations in FIG. 6, it is noted that an ordering or sequence of the operations may vary. For example, surface mounting of the power bus board may precede surface mounting of one or more of the power source and power-sink devices.

Figure 7:
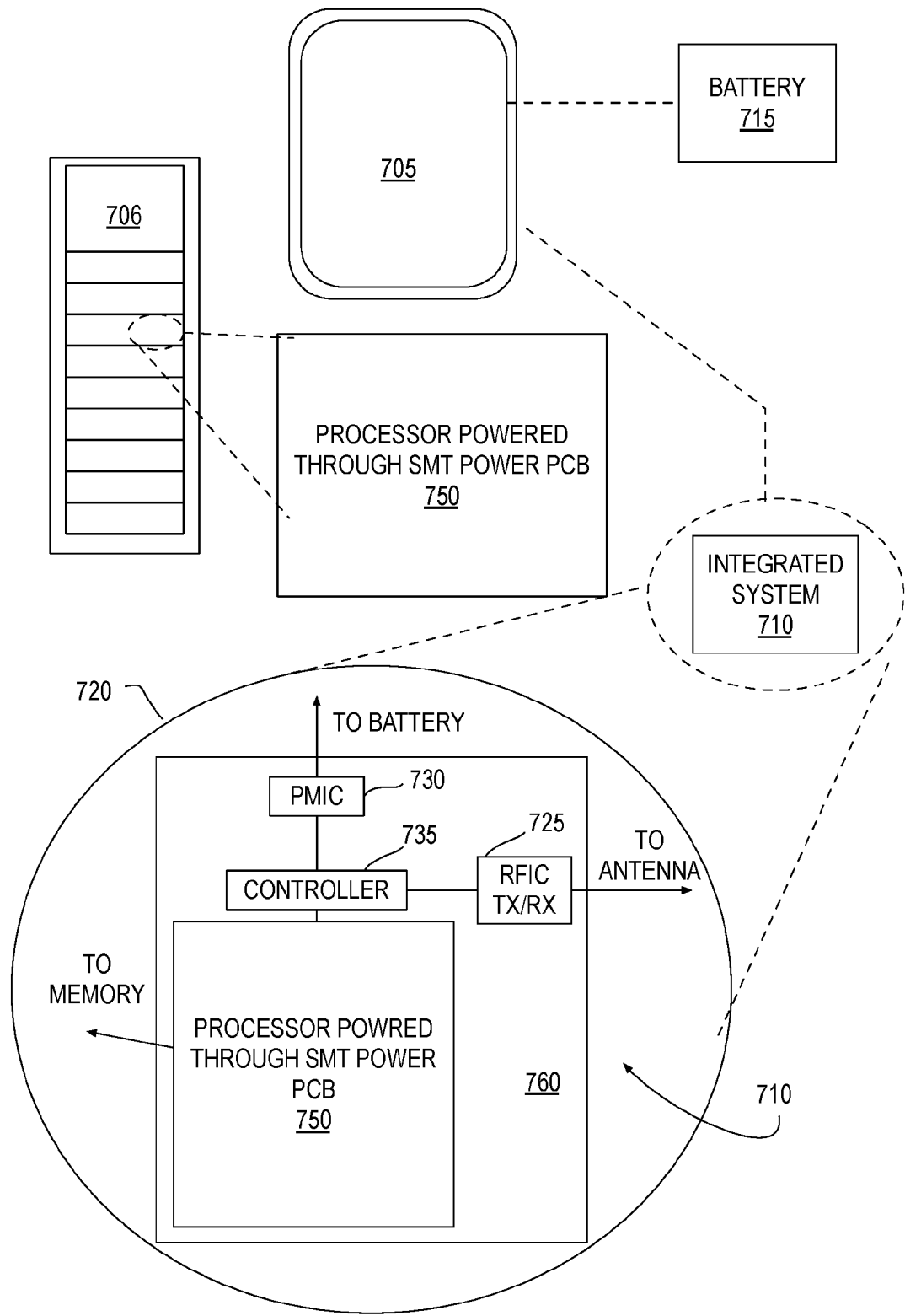
FIG. 7 illustrates a mobile computing platform and a data server machine employing a surface-mountable printed power delivery bus board to power a BGA-packaged microprocessor, in accordance with embodiments.

FIG. 7 illustrates a mobile computing platform and a data server machine employing one or more microprocessors powered, at least in part, through a power delivery bus board, for example as described elsewhere herein. The server machine 706 may be any commercial server, for example including any number of high-performance computing platforms disposed within a rack and networked together for electronic data processing, which in the exemplary embodiment includes a packaged monolithic SoC 750. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-layer or package-layer integrated system 710, and a battery 715.

Either disposed within the integrated system 710 illustrated in the expanded view 720, or as a stand-alone packaged chip within the server machine 706, monolithic SoC 750 includes a memory block (e.g., RAM) and a processor block (e.g., a microprocessor, a multi-core microprocessor, graphics processor, or the like). The monolithic SoC 750 may be further coupled to a board, a substrate, or an interposer 760 along with, one or more of a power management integrated circuit (PMIC) 730, RF (wireless) integrated circuit (RFIC) 725 including a wideband RF (wireless) transmitter and/or receiver (TX/RX) (e.g., including a digital baseband and an analog front end module further comprises a power amplifier on a transmit path and a low noise amplifier on a receive path), and a controller 735. In some embodiments, the packaged SoC 750 is powered, at least in part, through a power delivery bus board, for example as described elsewhere herein.

Functionally, PMIC 730 may perform battery power regulation, DC-to-DC conversion, etc., and so has an input coupled to battery 715 and with an output providing a current supply to other functional modules. In some embodiments, a power delivery bus board interconnects PMIC 730 to SoC 750, for example using any of the bus board architectures described elsewhere herein. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-layer modules may be integrated onto separate ICs or integrated into monolithic SoC 750.

Figure 8:
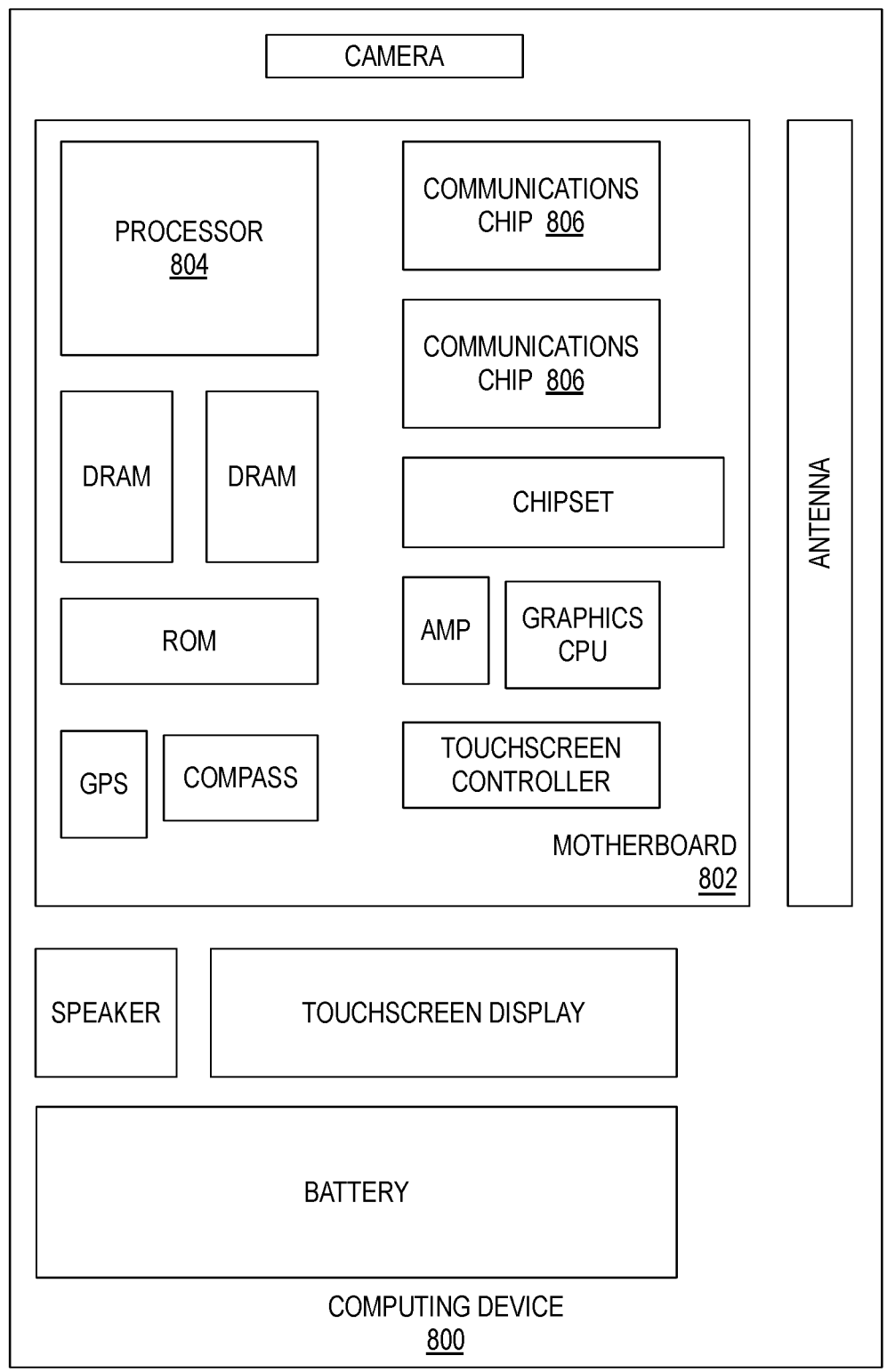
FIG. 8 is a functional block diagram of an electronic computing device, in accordance with some embodiments.

FIG. 8 is a functional block diagram of an electronic computing device, in accordance with some embodiments. Computing device 800 may be found inside platform 705 or server machine 706, for example. Device 800 further includes a motherboard 802 hosting a number of components, such as, but not limited to, a processor 804 (e.g., an applications processor), which may be in a package coupled to motherboard 802 by BGA connections, for example as described elsewhere herein. Such a processor may also be a portion of an SoC. In some examples, connections between the processor 804 and a power supply on motherboard 802 are through a power delivery bus board, for example including any of the features described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 806 may also be physically and/or electrically coupled to the motherboard 802. In further implementations, communication chips 806 may be part of processor 804. Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like. Any of these other components may also be coupled to motherboard 802 and may also be powered through a power delivery bus board, for example having any of the features described elsewhere herein.

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 806 may implement any of a number of wireless standards or protocols, including but not limited to those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first embodiments, an integrated circuit (IC) device assembly comprises a primary printed circuit board (PCB) further including first front-side pads disposed within a first front-side region of the primary PCB, second front-side pads disposed within a second front-side region of the primary PCB, first back-side pads disposed within a first back-side region, opposite the first front-side region, wherein the first back-side pads are electrically coupled through the primary PCB to the first front-side pads. The primary PCB further comprises second back-side pads disposed within a second back-side region, opposite the second front-side region, wherein the second back-side pads are electrically coupled through the primary PCB to a first portion of the second front-side pads, and a secondary PCB mounted to a back side of the primary PCB, the secondary PCB bridging a length between the first and second back-side regions and comprising two or more layers of conductive traces electrically coupling the first and second back-side pads.

In furtherance of the first embodiments, the assembly further comprises a power-source device mounted to the first front-side pads, and a power-sink device mounted to the second front-side pads.

In furtherance of the first embodiments immediately above, the power-sink device is in a ball-grid array (BGA) package and the second front-side pads are arrayed in a first pattern to accommodate the BGA package.

In furtherance of the first embodiments, the power-sink device comprises a number of power and ground connections equal to the first portion of the second front-side pads.

In furtherance of the first embodiments, the power-source device comprises one or more voltage regulators, and the power-sink device comprises a microprocessor.

In furtherance of the first embodiments immediately above, the voltage regulators include a plurality of power rails, and the two or more layers of conductive traces in the secondary PCB include at least a first conductive trace coupled to a first of the power rails, and at least a second conductive trace coupled to a second of the power rails.

In furtherance of the first embodiments immediately above, at least two of the two or more layers of conductive traces are coupled to a first of the power rails.

In furtherance of the first embodiments, the secondary PCB further comprises a first plurality of conductive surface features soldered to the first back-side pads, the first plurality of conductive surface features coupled to the conductive traces through one or more first vias extending through the secondary PCB, and a second plurality of conductive surface features soldered to the second back-side pads, the second plurality of conductive surface features coupled to the conductive traces through one or more second vias extending through the secondary PCB.

In furtherance of the first embodiments immediately above, the first and second plurality of conductive surface features comprise BGA pads coupled by solder balls to the first and second back-side pads.

In furtherance of the first embodiments immediately above, the first portion of the second front-side pads form an array having a first pattern to accommodate a ball grid array (BGA) package of a power-sink device, and the second plurality of BGA pads on the secondary PCB are in an array matching the first pattern to accommodate solder balls interconnecting the second plurality of BGA pads to the second back-side pads.

In furtherance of the first embodiments, a second portion of the second front-side pads form a perimeter surrounding the first portion of the second front-side pads. The primary PCB comprises two or more conductive trace layers comprising signal traces escaping from the second portion of the second front-side pads and extending into a region of the primary PCB that is bridged by the secondary PCB.

In furtherance of the first embodiments immediately above, the secondary PCB further comprises one or more discrete components disposed in on a surface region of the secondary PCB between the first and second plurality of conductive surface features.

In furtherance of the first embodiments immediately above, the two or more conductive traces include one or more ground traces and one or more power traces, and the discrete components are decoupling capacitors coupled across the ground and power traces.

In one or more second embodiments, a computer platform comprises a primary printed circuit board (PCB) further including first front-side pads disposed within a first front-side region of the primary PCB. The primary PCB further comprises second front-side pads disposed within a second front-side region of the primary PCB. The primary PCB further comprises first back-side pads disposed within a first back-side region, opposite the first front-side region, wherein the first back-side pads are electrically coupled through the primary PCB to the first front-side pads. The primary PCB further comprises second back-side pads disposed within a second back-side region, opposite the second front-side region, wherein the second back-side pads are electrically coupled through the primary PCB to a first portion of the second front-side pads. The platform comprises one or more voltage regulators mounted to the first front-side pads. The platform comprises one or more microprocessors mounted to the second front-side pads, the microprocessors having a number of power and ground connections equal to the first portion of the second front-side pads. The platform comprises a secondary PCB mounted to a back side of the primary PCB, the secondary PCB bridging a length between the first and second back-side regions and comprising two or more layers of conductive traces electrically coupling the first and second back-side pads.

In furtherance of the second embodiments immediately above, the microprocessors are in a ball-grid array (BGA) package and the first front-side pads arrayed in a first pattern to accommodate the BGA package. The secondary PCB further comprises a first plurality of BGA pads soldered to the first back-side pads, the first plurality of BGA pads coupled to the conductive traces through one or more first vias extending through the secondary PCB. The secondary PCB further comprises a second plurality of BGA pads soldered to the second back-side pads, the second plurality of BGA pads coupled to the conductive traces through one or more second vias extending through the secondary PCB. The second plurality of BGA pads on the secondary PCB are in an array matching the first pattern to accommodate solder balls interconnecting the second plurality of BGA pads to the second back-side pads.

In furtherance of the second embodiments, the platform further comprises a battery coupled to an input-side of the voltage regulators.

In one or more third embodiments, a method of assembling an printed circuit assembly (PCA) comprises receiving a primary printed circuit board (PCB) including first front-side pads disposed within a first front-side region of the primary PCB, second front-side pads disposed within a second front-side region of the primary PCB, and first back-side pads disposed within a first back-side region, opposite the first front-side region, wherein the first back-side pads are electrically coupled through the primary PCB to the first front-side pads. The primary PCB further comprises second back-side pads disposed within a second back-side region, opposite the second front-side region, wherein the second back-side pads are electrically coupled through the primary PCB to a first portion of the second front-side pads. The method further comprises mounting a power-source device to the first front-side pads, mounting a power-sink device to the second front-side pads, and mounting a secondary PCB to a back side of the primary PCB, the secondary PCB bridging a length between the first and second back-side regions and comprising two or more layers of conductive traces electrically coupling the first and second back-side pads.

In furtherance of the third embodiments the power-source device comprises one or more voltage regulators providing a plurality of power rails, the power-sink device comprises a microprocessor, the two or more layers of conductive traces in the secondary PCB include at least a first conductive trace coupled to a first of the power rails, and at least a second conductive trace coupled to a second of the power rails.

In furtherance of the third embodiments, mounting the secondary PCB includes soldering a first plurality of conductive surface features to the first back-side pads, the first plurality of conductive surface features coupled to the conductive traces through one or more first vias extending through the secondary PCB, and soldering a second plurality of conductive surface features to the second back-side pads, the second plurality of conductive surface features coupled to the conductive traces through one or more second vias extending through the secondary PCB.

In furtherance of the third embodiments, the method further includes soldering one or more discrete components onto a surface region of the secondary PCB between the first and second plurality of conductive surface features.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) device assembly, comprising:
 a primary printed circuit board (PCB) further including:
  first front-side pads disposed within a first front-side region of the primary PCB;
  second front-side pads disposed within a second front-side region of the primary PCB;
  first back-side pads disposed within a first back-side region, opposite the first front-side region, wherein the first back-side pads are electrically coupled through the primary PCB to the first front-side pads; and
  second back-side pads disposed within a second back-side region, opposite the second front-side region, wherein the second back-side pads are electrically coupled through the primary PCB to a first portion of the second front-side pads; and
 a secondary PCB mounted to a back side of the primary PCB, the secondary PCB bridging a length between the first and second back-side regions and comprising two or more layers of conductive traces electrically coupling the first and second back-side pads, the two or more layers of conductive traces including one or more ground traces and one or more power traces, and wherein the secondary PCB further comprises:
  a first plurality of ball grid array (BGA) pads coupled by solder to the first back-side pads, the first plurality of BGA pads coupled to the conductive traces through one or more first vias extending through the secondary PCB;
  a second plurality of BGA pads coupled by solder to the second back-side pads, the second plurality of BGA pads coupled to the conductive traces through one or more second vias extending through the secondary PCB; and
  one or more decoupling capacitors coupled across the ground and power traces.

2. The assembly of claim 1, further comprising:
 a power-source device mounted to the first front-side pads; and
 a power-sink device mounted to the second front-side pads.

3. The assembly of claim 2, wherein the power-sink device is in a ball-grid array (BGA) package and the second front-side pads are arrayed in a first pattern to accommodate the BGA package.

4. The assembly of claim 3, wherein the power-sink device comprises a number of power and ground connections equal to the first portion of the second front-side pads.

5. The assembly of claim 2, wherein:
 the power-source device comprises one or more voltage regulators; and
 the power-sink device comprises a microprocessor.

6. The assembly of claim 5, wherein:
 the voltage regulators include a plurality of power rails; and
 the two or more layers of conductive traces in the secondary PCB include at least a first conductive trace coupled to a first of the power rails, and at least a second conductive trace coupled to a second of the power rails.

7. The assembly of claim 6, wherein at least two of the two or more layers of conductive traces are coupled to a first of the power rails.

8. The assembly of claim 1, wherein: the first portion of the second front-side pads form an array having a first pattern to accommodate a ball grid array (BGA) package of a power-sink device; and the second plurality of BGA pads on the secondary PCB are in an array matching the first pattern to accommodate solder balls interconnecting the second plurality of BGA pads to the second back-side pads.

9. The assembly of claim 1, wherein:
 a second portion of the second front-side pads form a perimeter surrounding the first portion of the second front-side pads;
 the primary PCB comprises two or more conductive trace layers comprising signal traces escaping from the second portion of the second front-side pads; and
 the signal traces extend into a region of the primary PCB that is bridged by the secondary PCB.

10. A computer platform, comprising:
 the primary PCB and the secondary PCB of claim 1,
 one or more voltage regulators mounted to the first front-side pads; and
 one or more microprocessors mounted to the second front-side pads, the microprocessors having a number of power and ground connections equal to the first portion of the second front-side pads.

11. The platform of claim 10, wherein:
 the microprocessors are in a ball-grid array (BGA) package and the first front-side pads arrayed in a first pattern to accommodate the BGA package;
 the secondary PCB further comprises:
  a first plurality of BGA pads soldered to the first back-side pads, the first plurality of BGA pads coupled to the conductive traces through one or more first vias extending through the secondary PCB;
  a second plurality of BGA pads soldered to the second back-side pads, the second plurality of BGA pads coupled to the conductive traces through one or more second vias extending through the secondary PCB; and
 the second plurality of BGA pads on the secondary PCB are in an array matching the first pattern to accommodate solder balls interconnecting the second plurality of BGA pads to the second back-side pads.

12. The platform of claim 10, further comprising a battery coupled to an input-side of the voltage regulators.

13. An integrated circuit (IC) device assembly, comprising:
   a first printed circuit board (PCB) further including:
      first front-side pads disposed within a first front-side region of the first PCB;
      first back-side pads disposed within a first back-side region, opposite the first front-side region, wherein the first back-side pads are electrically coupled through the first PCB to the first front-side pads;
      second front-side pads disposed within a second front-side region of the first PCB;
      second back-side pads disposed within a second back-side region, opposite the second front-side region, wherein the second back-side pads are electrically coupled through the first PCB to at least a portion of the second front-side pads; and
   a second PCB mounted to a back side of the first PCB, the second PCB bridging a length between the first and second back-side regions and comprising two or more layers of conductive traces electrically coupling the first and second back-side pads, wherein the two or more layers of conductive traces include one or more ground traces and one or more power traces, and wherein the secondary PCB further comprises:
      a first plurality of conductive surface features coupled through solder to the first back-side pads, the first plurality of conductive surface features coupled to the conductive traces through one or more first vias in the second PCB;
      a second plurality of conductive surface features coupled through solder to the second back-side pads, the second plurality of conductive surface features coupled to the conductive traces through one or more second vias in the second PCB; and
      one or more decoupling capacitors on the second PCB, wherein the one or more decoupling capacitors are coupled across the ground and power traces.

14. The assembly of claim 13, wherein the decoupling capacitors and the first and second plurality of conductive surface features are on a same side of the second PCB, and wherein the decoupling capacitors are located between the first and second plurality of conductive surface features.

15. The assembly of claim 13, wherein the decoupling capacitors and the first and second plurality of conductive surface features are on a opposite sides of the second PCB, and wherein the decoupling capacitors are located between the first and second plurality of conductive surface features.

16. The assembly of claim 13, further comprising:
   a power-source device mounted to the first front-side pads; and
   a power-sink device mounted to the second front-side pads.

17. The assembly of claim 16, wherein:
   the power-source device comprises one or more voltage regulators; and
   the power-sink device comprises a microprocessor.

* * * * *